(12) United States Patent
Sakato et al.

(10) Patent No.: US 11,201,622 B2
(45) Date of Patent: Dec. 14, 2021

(54) INFORMATION PROCESSING APPARATUS, CONTROL METHOD THEREOF, AND NON-TRANSITORY COMPUTER-READABLE STORAGE MEDIUM

(71) Applicant: CANON KABUSHIKI KAISHA, Tokyo (JP)

(72) Inventors: Kazuma Sakato, Kanagawa (JP); Yohei Horikawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/157,605

(22) Filed: Jan. 25, 2021

(65) Prior Publication Data

US 2021/0234543 A1 Jul. 29, 2021

(30) Foreign Application Priority Data

Jan. 27, 2020 (JP) .............................. JP2020-011044

(51) Int. Cl.
*H03K 19/0175* (2006.01)
*G06F 1/08* (2006.01)
*G06F 7/57* (2006.01)

(52) U.S. Cl.
CPC ....... *H03K 19/017581* (2013.01); *G06F 1/08* (2013.01); *G06F 7/57* (2013.01)

(58) Field of Classification Search
CPC ..... H03K 19/017581; G06F 1/08; G06F 7/57; G06F 5/01; G06F 2205/104
USPC .................................................... 326/38–41
See application file for complete search history.

(56) References Cited

U.S. PATENT DOCUMENTS

| | | | | |
|---|---|---|---|---|
| 5,471,593 | A * | 11/1995 | Branigin | G06F 9/30018 712/219 |
| 6,317,825 | B1 * | 11/2001 | Commercial | G06F 9/30018 708/490 |
| 6,574,579 | B1 * | 6/2003 | Watanabe | G01R 31/31922 702/124 |
| 2005/0273631 | A1 * | 12/2005 | Shu | G09C 1/00 713/190 |

(Continued)

FOREIGN PATENT DOCUMENTS

| JP | 2006-025379 A | 1/2006 |
|---|---|---|
| JP | 2006-244519 A | 9/2006 |

*Primary Examiner* — Don P Le
(74) *Attorney, Agent, or Firm* — Cowan, Liebowitz & Latman, P.C.

(57) ABSTRACT

The invention provides an apparatus comprising a programmable circuit including a plurality of 2-input 1-output ALUs, and an updating unit updating the programmable circuit according to circuit information, wherein each of the ALUs includes a calculation unit which performs a set type of calculation for two data and output a calculation result, a delay unit which delays the two input data in accordance with delay amounts independently set and supplies the delayed data to the calculation unit, and a controller which controls a delay amount for the delay unit and a calculation timing for the calculation unit in accordance with externally set information, wherein the updating unit sets clock gating start timings for a plurality of delay elements of the delay unit if an ALU of interest as a first processing circuit in the programmable circuit inputs final data to be processed.

7 Claims, 20 Drawing Sheets

(56) References Cited

U.S. PATENT DOCUMENTS

| | | | | |
|---|---|---|---|---|
| 2007/0136619 | A1* | 6/2007 | Chen | G06F 1/04 |
| | | | | 713/500 |
| 2008/0082787 | A1* | 4/2008 | Yamazaki | G06F 15/8007 |
| | | | | 712/17 |
| 2008/0143383 | A1* | 6/2008 | Wong | G06F 9/3869 |
| | | | | 326/46 |
| 2008/0282071 | A1* | 11/2008 | Takebe | G06F 9/35 |
| | | | | 712/228 |
| 2011/0047353 | A1* | 2/2011 | Matsuno | G06F 15/8007 |
| | | | | 712/29 |
| 2013/0002292 | A1* | 1/2013 | Higuchi | G06F 15/7875 |
| | | | | 326/37 |
| 2013/0080740 | A1* | 3/2013 | Gentle | G06F 9/30094 |
| | | | | 712/205 |
| 2014/0118717 | A1* | 5/2014 | Bang | G01S 7/484 |
| | | | | 356/5.01 |
| 2019/0327089 | A1* | 10/2019 | Liu | H04L 9/16 |
| 2021/0063250 | A1* | 3/2021 | Park | G01K 7/01 |

* cited by examiner

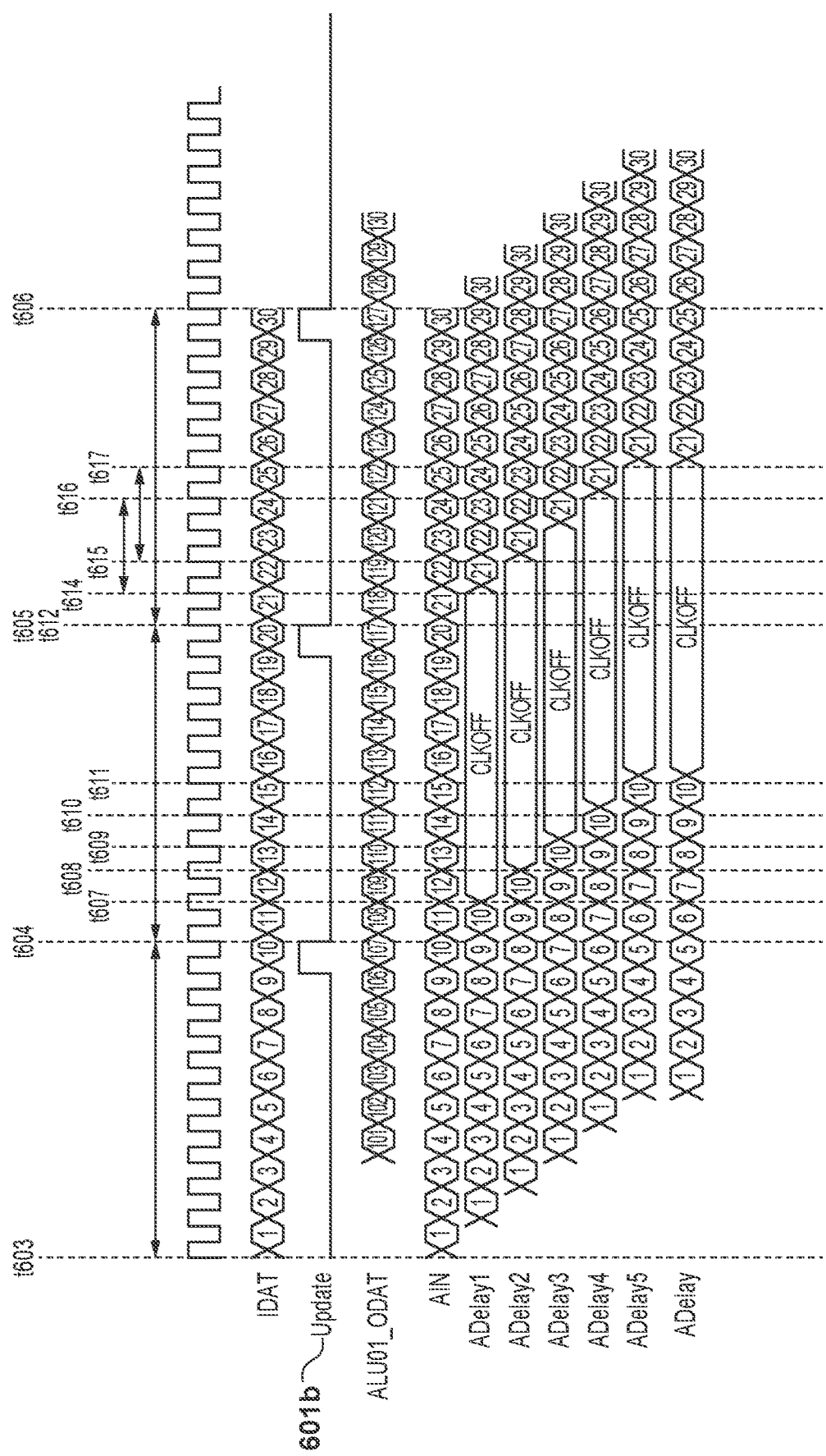

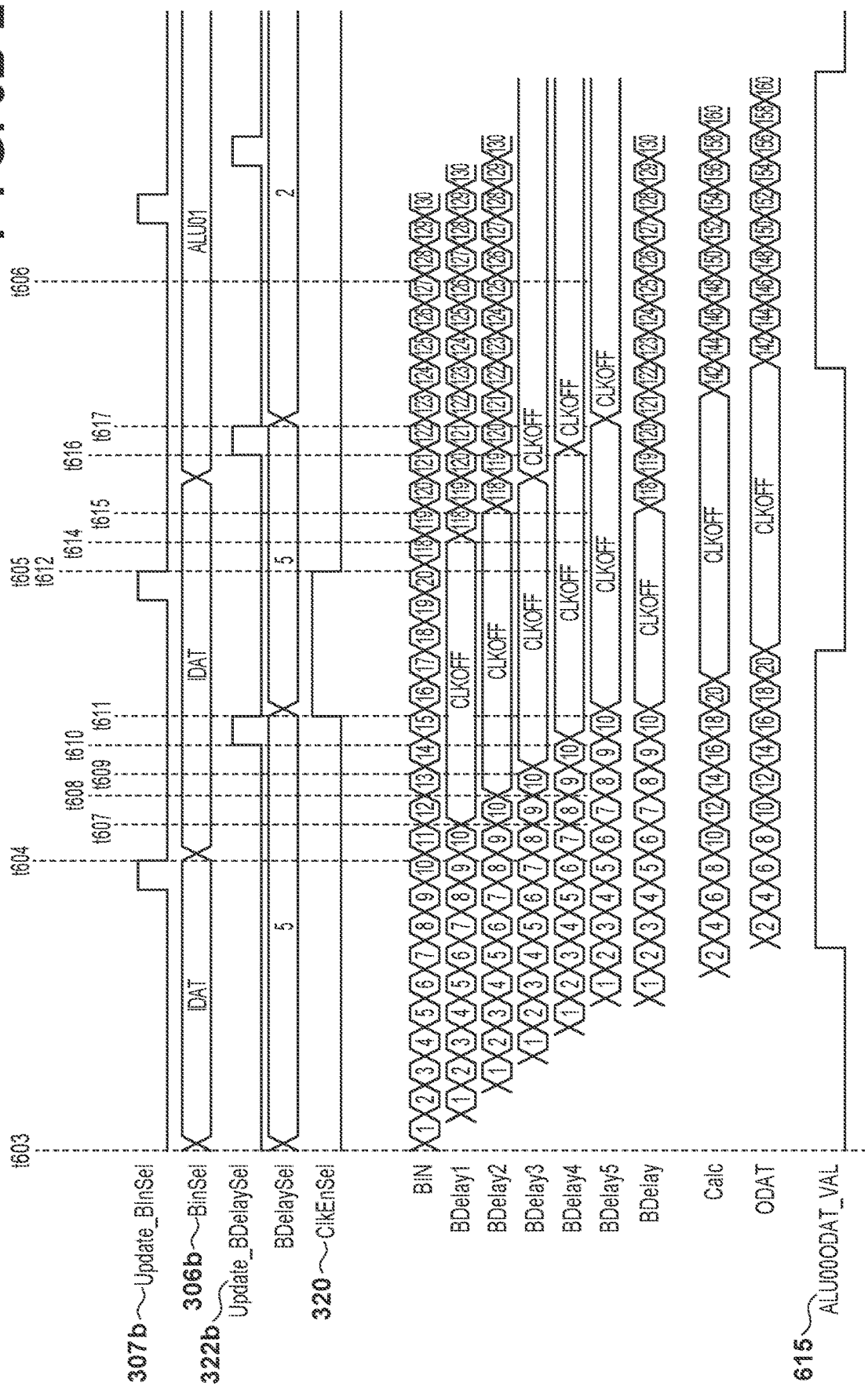

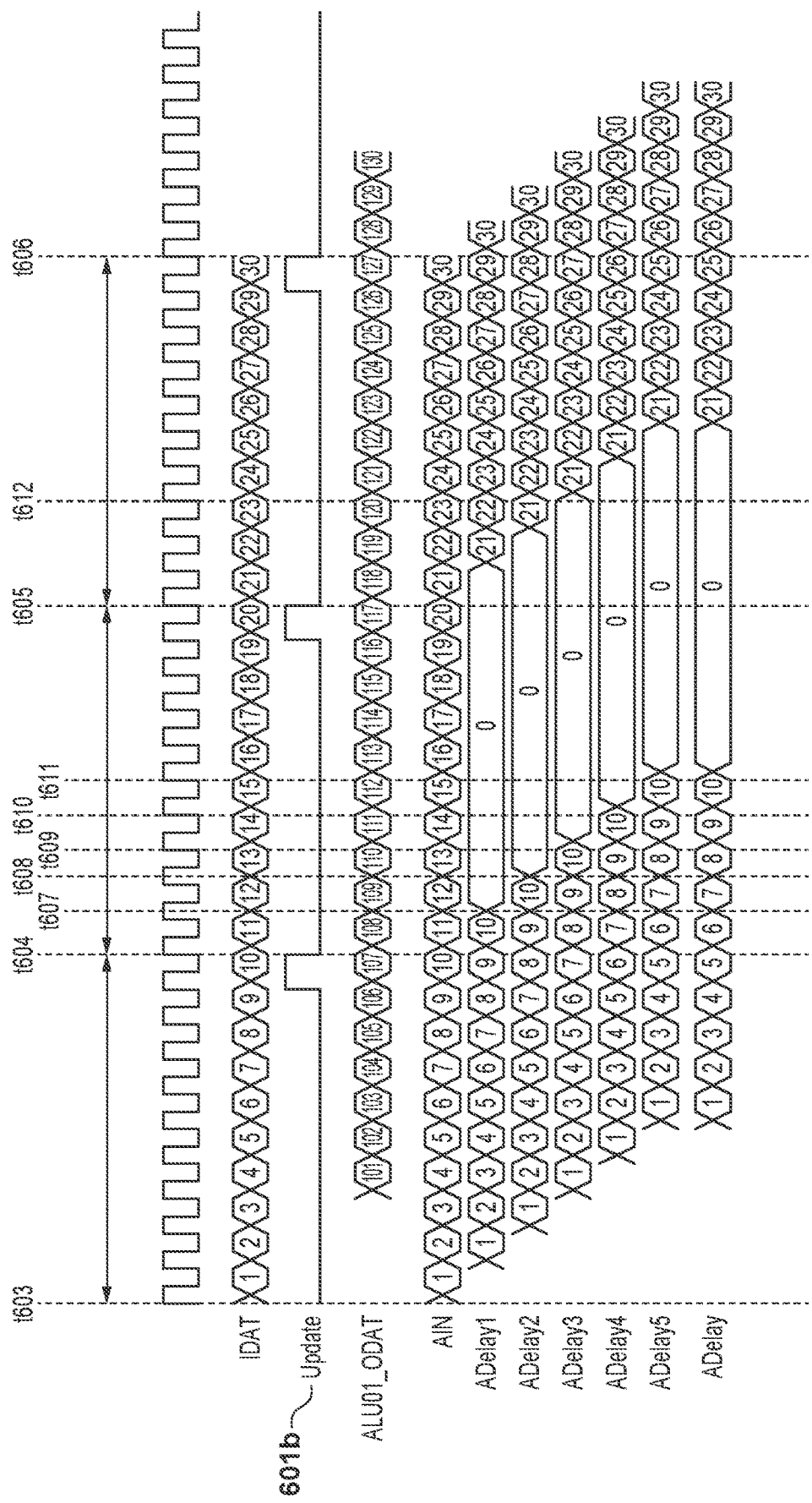

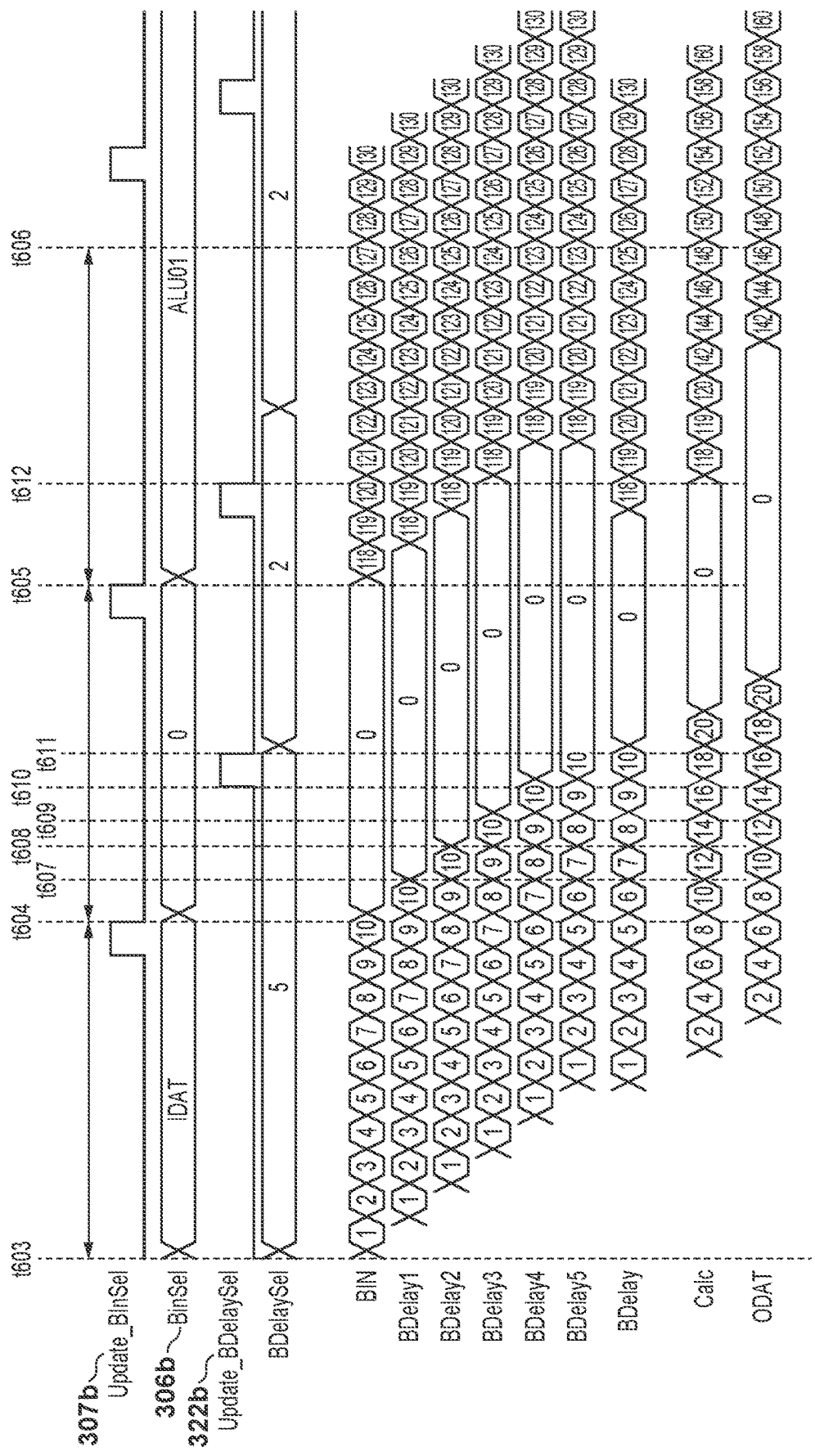

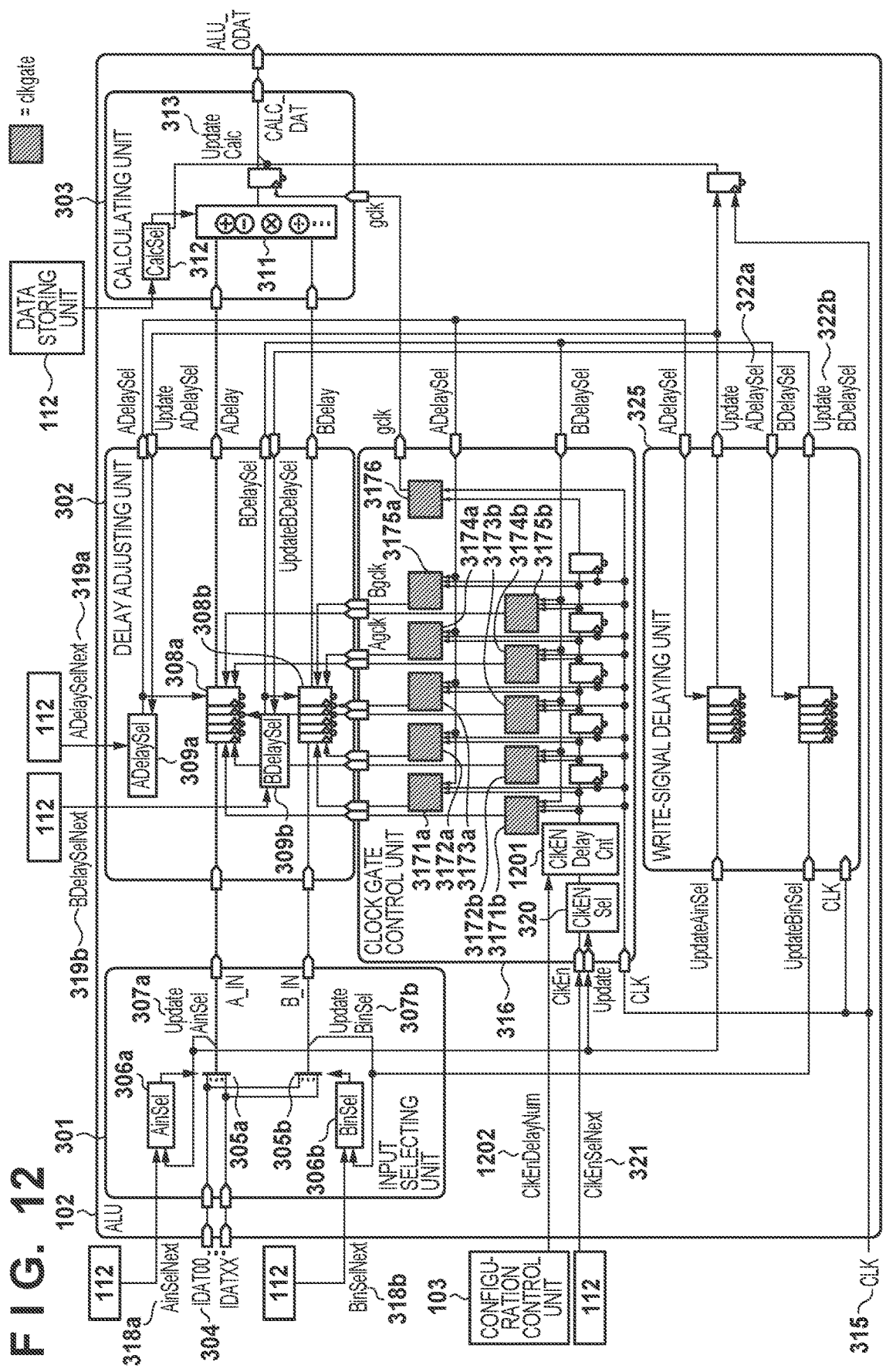

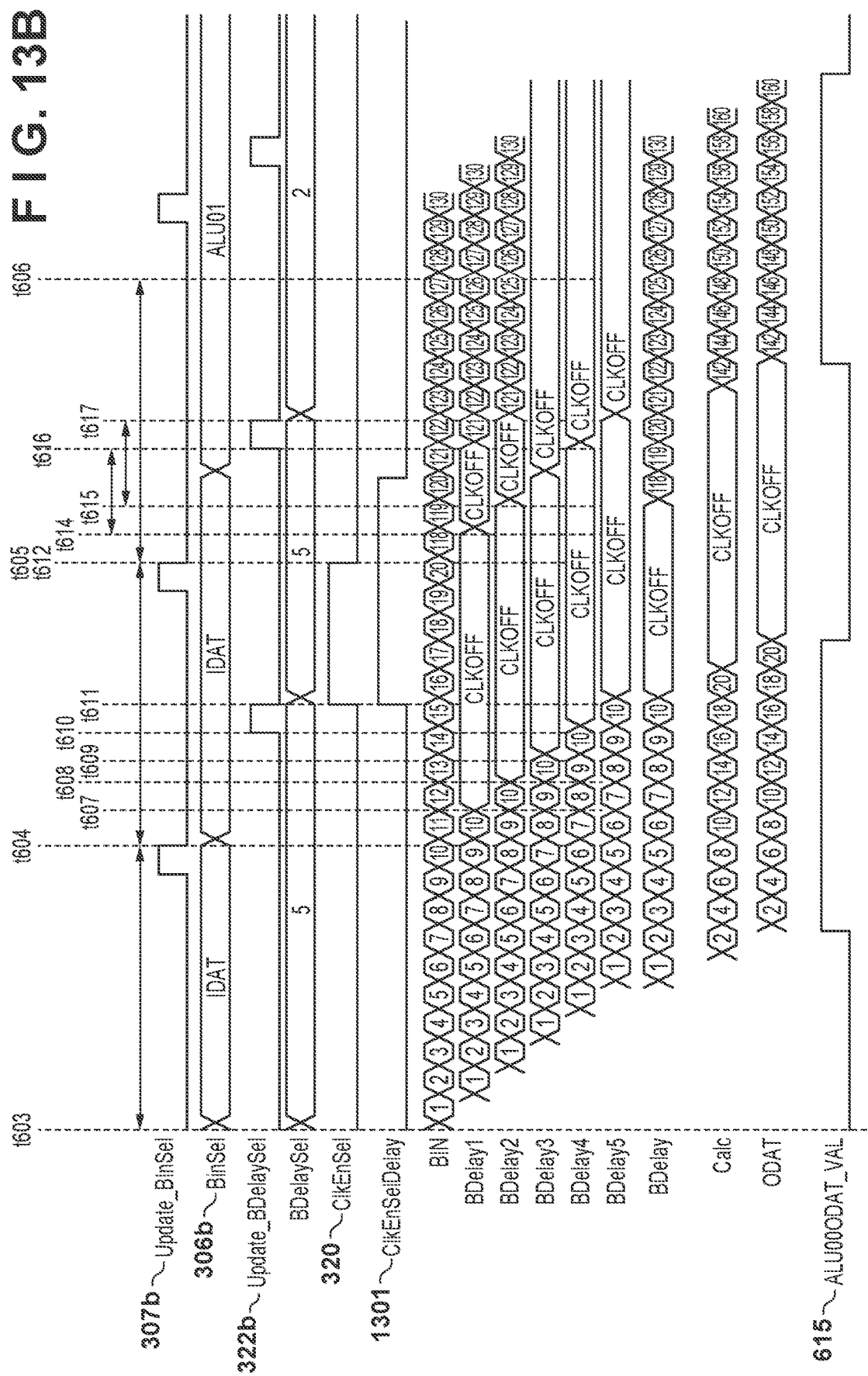

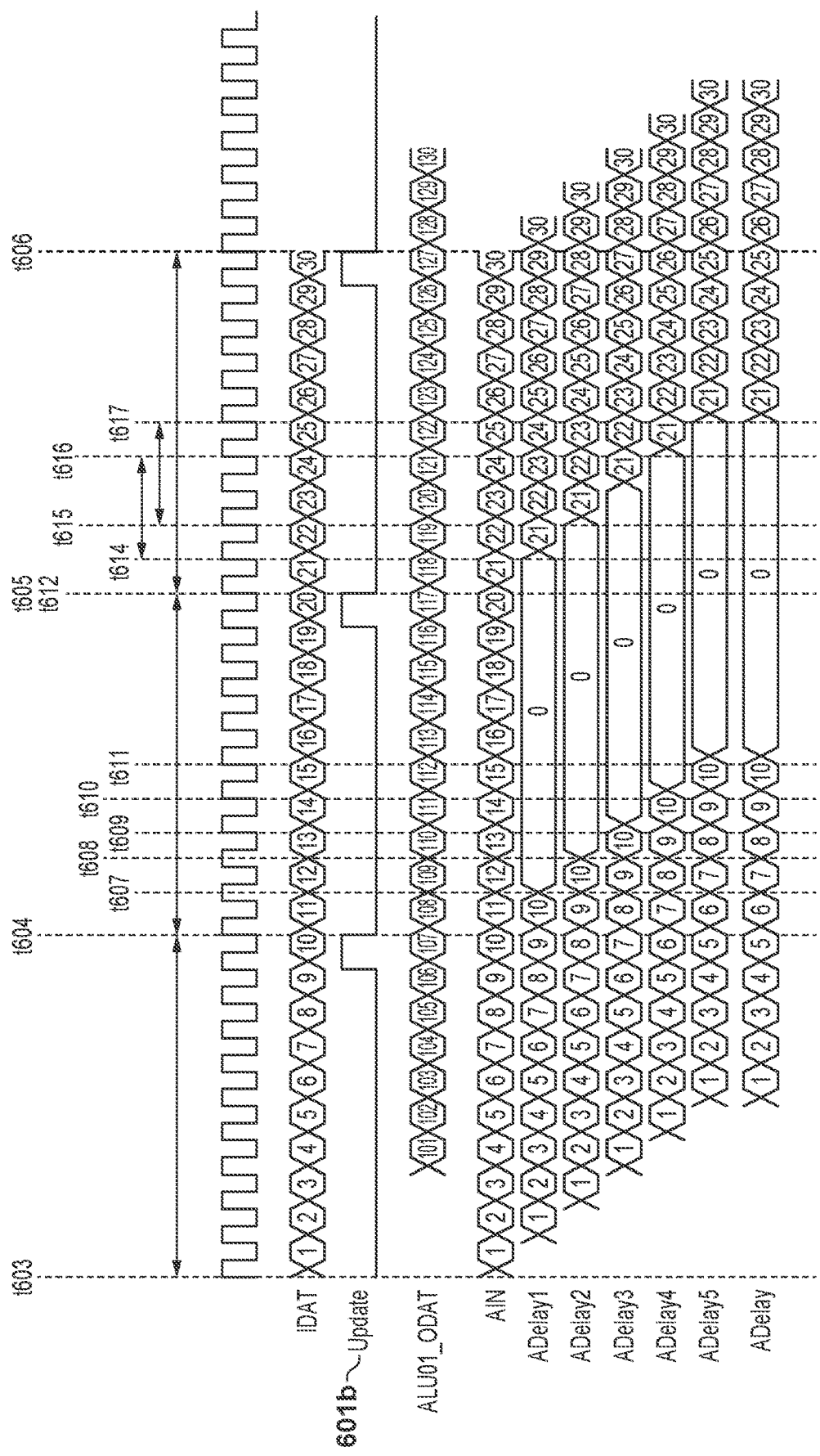

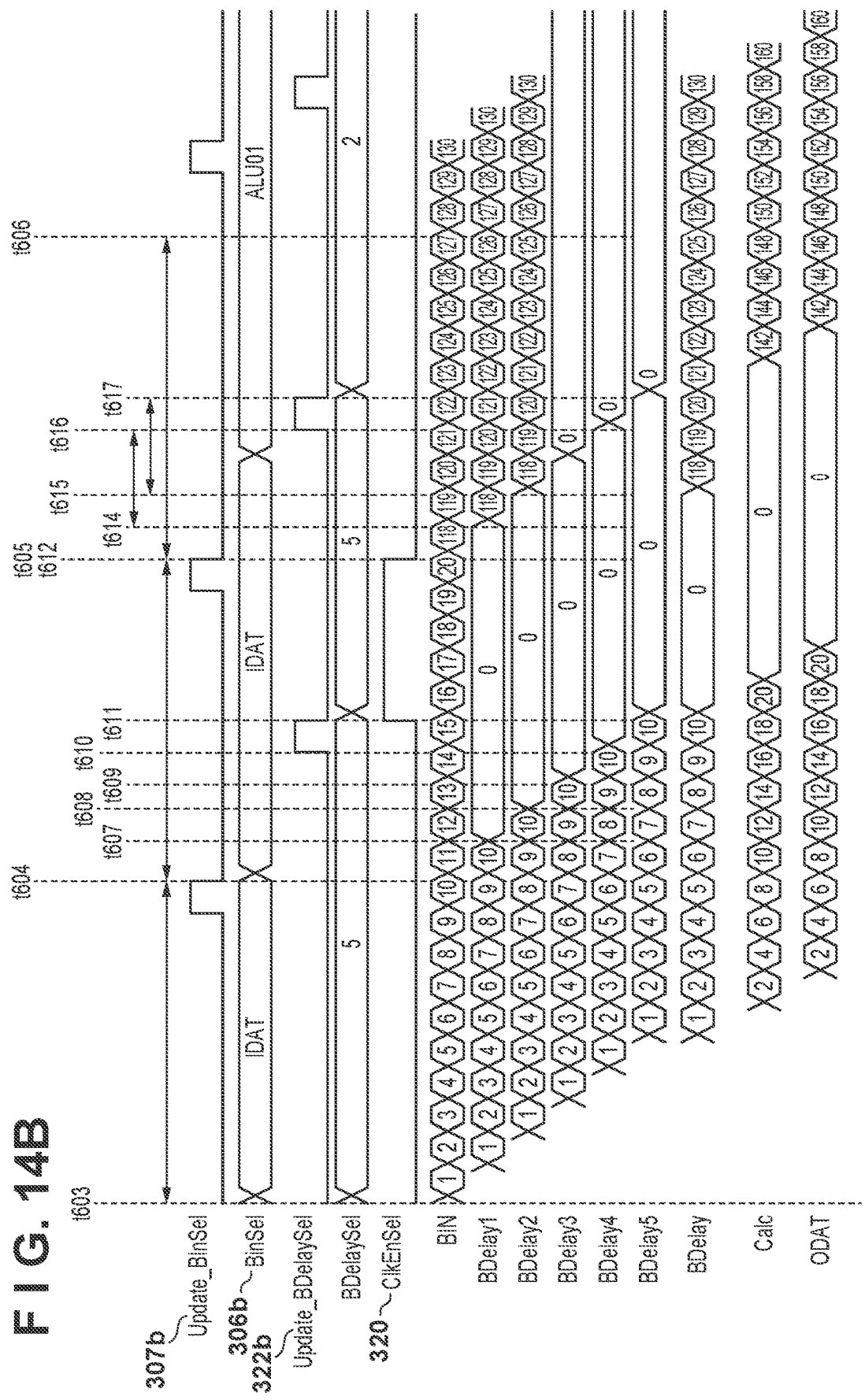

INFORMATION PROCESSING APPARATUS, CONTROL METHOD THEREOF, AND NON-TRANSITORY COMPUTER-READABLE STORAGE MEDIUM

BACKGROUND OF THE INVENTION

Field of the Invention

The present invention relates to an information processing apparatus, a control method thereof, and a non-transitory computer-readable storage medium.

Description of the Related Art

There is known a programmable circuit such as an FPGA (Field Programmable Gate Array) or a PLD (Programmable Logic Device) capable of freely arranging the internal function of a circuit. This programmable circuit can implement a desired processing circuit using, for example, an ALU (Arithmetic and Logic Unit) having a plurality of internal element circuits. In addition, in this programmable circuit, configuration information defining the function of the ALU can be written to switch the processing circuits (for example, patent literature 1: Japanese Patent Laid-Open No. 2006-25379).

In addition, the programmable circuit has a larger circuit scale and higher power consumption than an ASIC (Application Specific Integrated Circuit) specifically serving as only one processing circuit in order to ensure its degree of freedom. For this reason, there is also a technique of decreasing a power supply voltage supplied to an ALU which is not used for calculation (for example, patent literature 2: Japanese Patent Laid-Open No. 2006-244519).

However, in order to prevent damage of data, the data must be written after the processing circuit completes the calculation of an input signal when configuration information is written. For this purpose, the input data must be stopped until the end of calculation. It is difficult to increase the throughput. As described in patent literature 2, in an arrangement for decreasing the power supply voltage after all the calculation results are output from the processing circuit, it is difficult to decrease the power consumption for each ALU which has completed the calculation before the calculation results are completely output.

SUMMARY OF THE INVENTION

According to an aspect of the invention, there is provided an information processing apparatus comprising: a programmable circuit including a plurality of 2-input 1-output ALUs (Arithmetic and Logic Units); and an updating unit configured to update the programmable circuit in accordance with circuit information set at a set timing, wherein each of the ALUs in the programmable circuit includes a calculation unit configured to perform a set type of calculation for two data and output a calculation result, a delay unit configured to delay the two input data in accordance with delay amounts independently set and supply the delayed data to the calculation unit, and a controller configured to control a delay amount for the delay unit and a calculation timing for the calculation unit in accordance with externally set information, and wherein the updating unit sets clock gating start timings for a plurality of delay elements of the delay unit if an ALU of interest as a first processing circuit in the programmable circuit inputs final data to be processed.

Further features of the present invention will become apparent from the following description of exemplary embodiments (with reference to the attached drawings).

BRIEF DESCRIPTION OF THE DRAWINGS

FIGS. 6B-1 and 6B-2 are timing charts of the programmable circuit shown in FIG. 6A;

FIGS. 10A and 10B are timing charts of a programmable circuit according to the fourth embodiment;

FIG. 12 is a block diagram showing the arrangement of an ALU according to the second embodiment;

FIGS. 13A and 13B are timing charts of a programmable circuit according to the second embodiment; and FIGS. 14A and 14B are timing charts of the programmable circuit according to the fourth embodiment.

DESCRIPTION OF THE EMBODIMENTS

Figure 1:
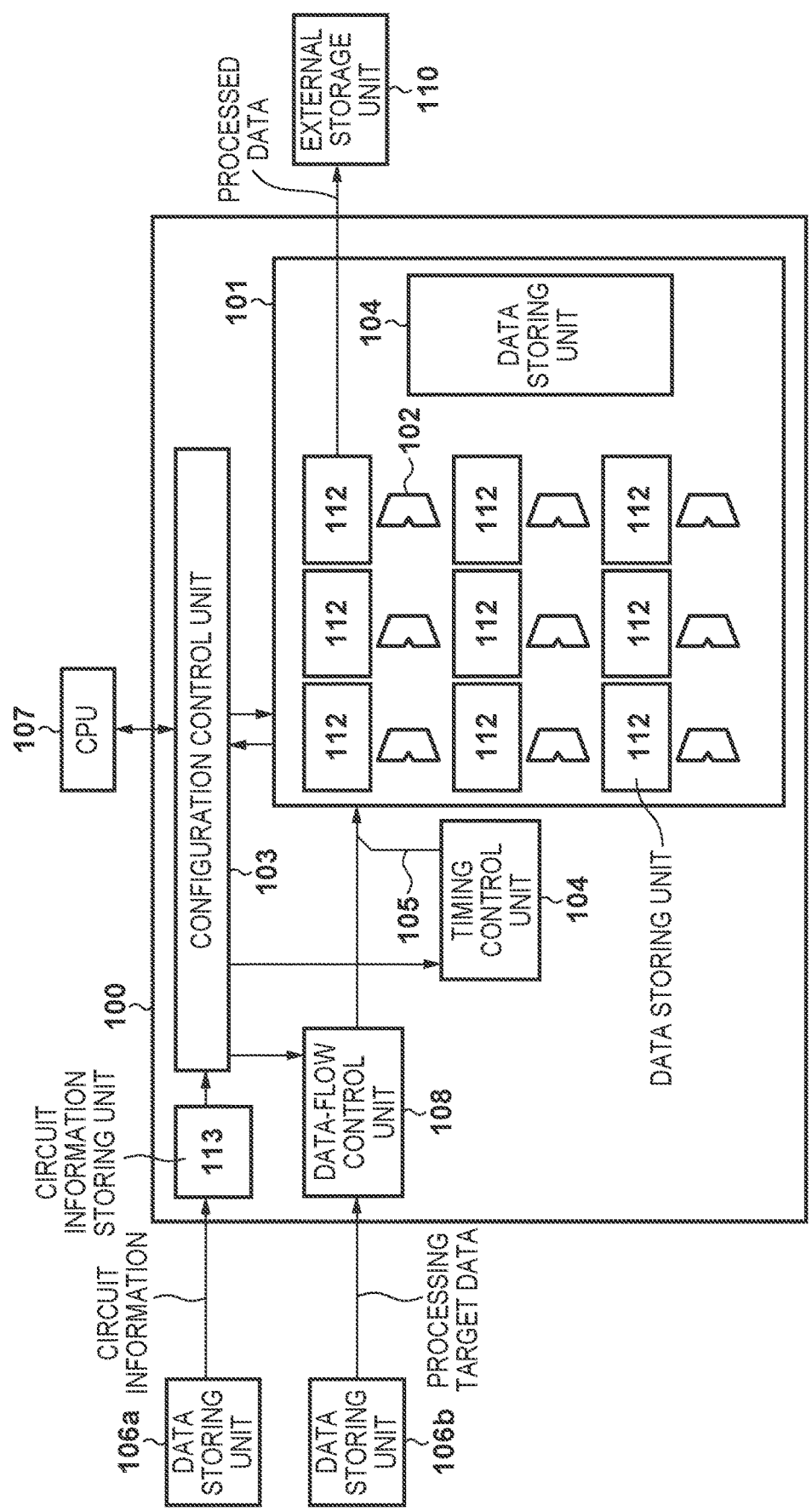
FIG. 1 is a block diagram showing a signal processing apparatus according to the first embodiment.

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention. Furthermore, in the attached drawings, the same reference numerals are given to the same or similar configurations, and redundant description thereof is omitted.

First Embodiment

FIG. 1 is a block diagram of an information processing apparatus according to the first embodiment. This apparatus includes a CPU 107 for controlling the overall apparatus, data storing devices 106a and 106b, a signal processing device 100, and an external storing device 110. Note that the information processing apparatus of this embodiment will be described by mounting the apparatus in an image capturing apparatus represented by a digital camera. Various kinds of hardware are arranged in the image capturing apparatus, but it should be understood that only portions related to the embodiment are illustrated in FIG. 1 because the various kinds of hardware are not the main subject of this embodiment.

The signal processing device 100 includes a programmable circuit unit 101, a configuration control unit 103, a circuit information storing unit 113, a timing control unit 104, and a data-flow control unit 108.

The programmable circuit unit 101 is formed by an FPGA or a PLD, receives, as processing target data, data held in the data storing device 106b, and executes set signal processing. The programmable circuit unit 101 includes a plurality of data storing units 112 configured to hold configuration information, a plurality of ALUs (Arithmetic and Logic Units) 102 serving as element circuits, and a data storing unit 104. Each data storing unit 112 is a register configured to hold configuration information transferred from the configuration control unit 103. Each ALU 102 is a 2-input 1-output arithmetic and logic unit, selects two signals from the plurality of signals based on the configuration information held in each data storing unit 112, performs a desired calculation such as addition or subtraction on these two signals, and outputs the calculation result. By combining these ALUs 102, a desired processing circuit can be implemented.

The circuit information storing unit 113 is a memory represented by an SRAM configured to hold circuit information (including information concerning write timing) held in the data storing device 106a. The configuration control unit 103 to be described later refers to the circuit information a plurality of times. For this purpose, the circuit information is saved in advance in the high-speed accessible circuit information storing unit 113 in the signal processing device 100. This is because the circuit information storing unit 113 is formed by the SRAM.

The configuration control unit 103 reads out the circuit information held in the circuit information storing unit 113. The configuration control unit 103 transfers, as the configuration information, information obtained by decoding the readout circuit information to the desired data storing unit 112 and sets it in the desired data storing unit 112. In addition, the configuration control unit 103 defines a timing for generating a write-signal 105 (to be described later) in the timing control unit 104 (to be described later). Furthermore, the configuration control unit 103 sets control information necessary for the flow control of the input processing data in the data-flow control unit 108 (to be described later).

Under the control of the configuration control runt 103, the timing control unit 104 generates the pulse of the write-signal 105 (to be described later) at an arbitrary timing, and the write-signal is propagated in synchronism with the input processing target data.

The write-signal 105 is a load signal for notifying a timing for updating the configuration information of each of the plurality of ALUs 102. The write-signal 105 is propagated in the programmable circuit unit 101.

The timing for generating the write-signal 105 is desirably set such that the write-signal 105 is issued at a final processing timing of the data to be processed in a desired processing circuit. When the write-signal 105 is issued at the final processing timing of the data to be processed, each ALU can update the configuration information after each ALU completes processing of a desired number of data. Alternatively, the write-signal may be issued at the first timing of the data to be processed. If the write-signal is issued at the final processing timing of the data, the configuration information must be updated for all the ALUs before the processing in the first processing circuit is executed. If the write-signal is issued at the first timing of the data to be processed, the data stop period of one cycle is required at the timing at which the updating is performed, but the updating operation may be omitted.

The data-flow control unit 108 controls processing data to be input to and output from the programmable circuit unit 101. In addition, the data-flow control unit 108 performs an operation for controlling the input based on the control information transferred from the configuration control unit 103.

The data storing unit 114 is a buffer memory for temporarily holding the calculation result in the programmable circuit unit 101 and formed by a high-speed access SRAM. This data storing unit 114 plays a role as a line buffer for, for example, calculating one-line correction value for shading correction and performing filter processing.

The data storing device 106a is a temporary storing unit configured to store circuit information used in the signal processing device 100 of this embodiment and formed by a memory represented by a DRAM. Similarly, the data storing device 106b is a temporary storing unit configured to store processing data used in the signal processing device 100 of this embodiment and formed by a memory represented by a DRAM. These storing units provide the work area of the CPU 107 (to be described later).

The CPU 107 is a control unit such as a processor configured to execute calculation processing and control processing in accordance with programs stored in the internal ROM and controls the overall apparatus. The external storing device 110 is a data holding unit capable of recording data of an CF (Compact Flash©), an SD card, or the like.

Figure 3:
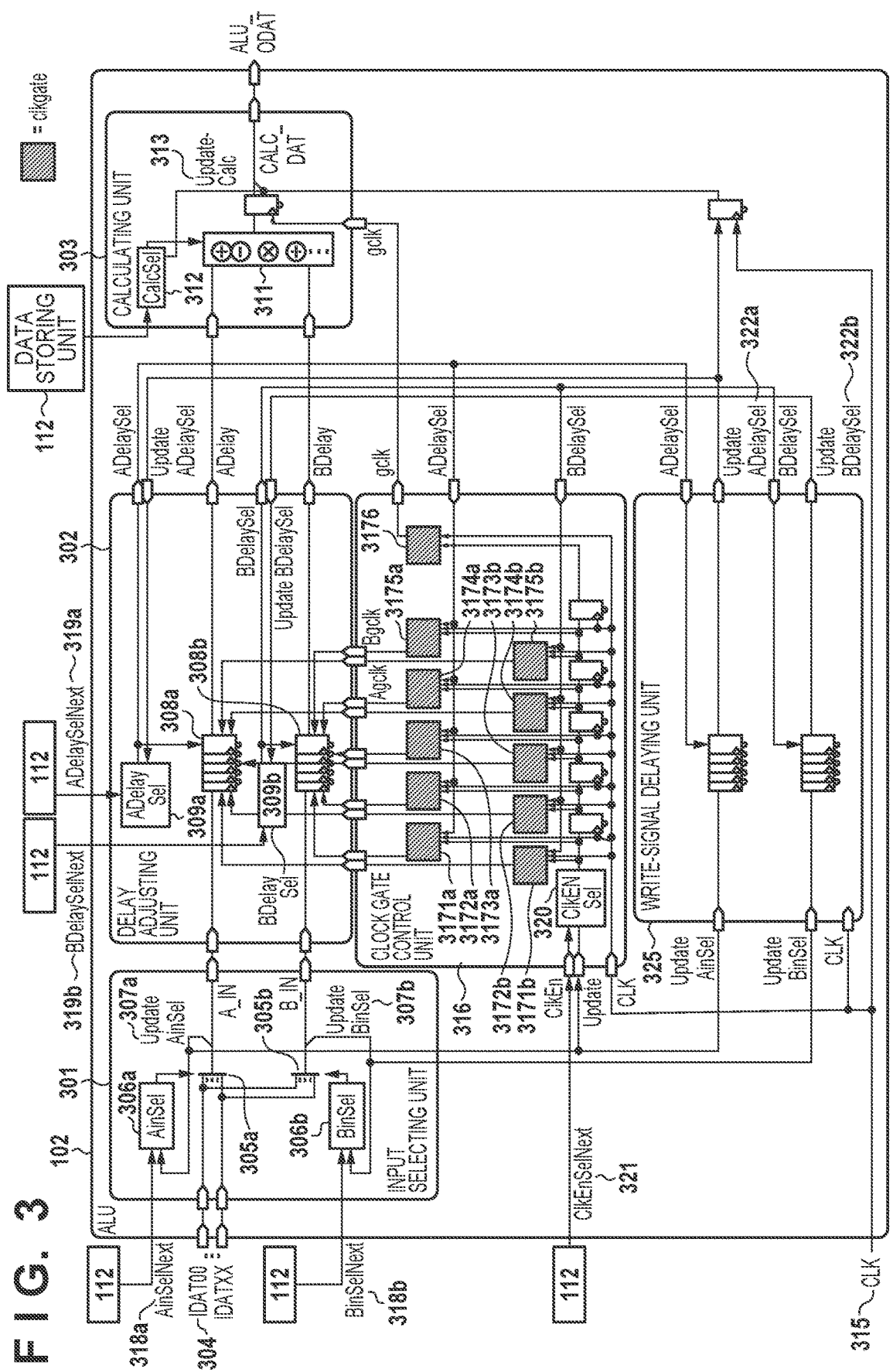
FIG. 3 is a block diagram showing the arrangement of an ALU according to the first embodiment.

Next, the internal arrangement of each ALU 102 in the signal processing device 100 will be described below. A large number of ALUs 102 in the signal processing device 100 have the same arrangement. FIG. 3 shows the arrangement of one of the ALUs 102.

The ALU 102 mainly includes an input selecting unit 301, a delay adjusting unit 302, a calculating unit 303, a clock gate control unit 316, and a write-signal delaying unit 325. Although the ALU 102 is handled as a 2-input 1-output arithmetic and logic unit, the delay amount of each input can be independently adjusted, and the delays of the selected input signals before the internal calculation units are aligned.

The input selecting unit 301 selects two signals used in the ALU 102 from a plurality of signals 304. One of the plurality of signals 304, for example, processing data input from the data storing device 106b and the output signals from plural existing remaining ALUs 102 can be selected. The selected signals are output as A-side input data A_IN and a B-side input data B_IN. More specifically, an A-side input selector 305a outputs, as A_IN to the delay adjusting unit 302, the signal selected from the plurality of input signals based on the setting value of an A-side input data selecting register AinSel 306a. A B-side input selector 305b outputs, as B_IN to the delay adjusting unit 302, the signal selected from the plurality of input signals based on the setting value of a B-side input data selecting register BinSel 306b.

Each of the plurality of data storing units 306a and 306b and data storing units 309a, 309b, and 312 present in each ALU 102 is formed by a register configured to hold the setting value of the corresponding selector configured to select the signal. The setting values set in the plurality of registers are part of the configuration information held in the data storing units 112.

The data storing units 306a and 306b configured to hold the setting values for selecting the input data refer to the write-signals 105 propagated in synchronism with the signals output from the selectors 305a and 305b respectively corresponding to the data storing units 306a and 306b. If the write-signals 105 are set high, the data storing units 306a and 306b load (update) the setting values held in them. For example, the A-side input data selecting register 306a refers to a write-signal 307a propagated in synchronism with the signal A_IN. If the write-signal 307a is set high, the register 306a sets a setting value 318a held in the data storing unit 112. In this manner, by propagating the write-signal in synchronism with the input signal, the setting value can be updated at the final processing timing in each of the plurality of registers.

The delay adjusting unit 302 inputs the input signals A_IN and B_IN selected by the input selecting unit 301 to adjust (delay adjustment) the output timings of these input signals. For this purpose, the delay adjusting unit 302 includes multi-stage delay units 308a and 308b and can implement delay adjustment by forming a shift register. The example in FIG. 3 shows an arrangement capable of delay amount adjustment of five stages. However, the number of stages capable of performing delay adjustment is not limited to this. By arranging the A-side delay selecting register 309a, the delay adjusting unit 302 outputs, to the calculating unit 303 of the subsequent stage, the input signal A_IN delayed by the number of desired stages in the delay unit 308a. Similarly, by setting the A-side delay selecting register 309b, the delay adjusting unit 302 outputs, to the calculating unit 303 of the subsequent stage, the input signal B_IN delayed by the number of desired stages in the delay unit 308b.

The calculating unit 303 performs the set calculation using the two input signals whose delays are adjusted. The illustrated calculation unit is merely an example of this embodiment. The type of calculation unit is not limited to a specific one. For example, the calculation unit may be mounted with an arithmetic and logic unit such as an AND gate or an OR gate, a comparison calculation unit, and the like. A bit shift mechanism may be arranged after the calculation unit. A calculation result selector 311 selects the calculation result based on the setting value of the calculation result selecting register 312 and outputs the calculation result to the subsequent stage as the output of the ALU 102. The calculation result selecting selector 311 updates the setting value to the next setting value at a timing at which the write-signal 105 obtained upon delay adjustment in the write-signal delaying unit 325 reaches the calculation result selector 311. Although an A-side write-signal 322a is used in FIG. 3, a write-signal 322h may be selected.

The write-signal delaying unit 325 delays the write-signal 307a and a write-signal 307b output from the input selecting unit 301. The setting values of the delay selecting registers 309a and 309b are referred to in order to make the delay amounts of the write-signals 307a and 307b equal to the delay amount set by the delay adjusting unit 302.

As a result, when the write-signals are input, the calculating unit 303 can execute the calculation processing defined by immediately preceding write-signals for the data that was inputted immediately previously.

The clock gate control unit 316 performs clock gating (clock stopping) of the delay adjusting unit 302 and the calculating unit 303. The clock gate control unit 316 includes a plurality of clock gate units 3171a to 3175a, 3171b to 3175b, and 3176, and a clock enable setting register 320.

The programmable circuit unit 101 according to this embodiment implements predetermined processing using the plurality of ALUs 102. The ALU which is not used to implement target processing is subjected to clock gating so that the power consumption of the programmable circuit unit 101 is reduced. For the ALU 102, the clock gate control unit 316 updates the enable signal of the clock gate at a timing at which the write-signal 105 reaches the clock enable setting register 320, and the enable signal is delayed and propagated to the clock gate units 3171a, 3171b, 3175a, 3175b. Since the write-signal 105 is propagated in synchronism with the final timing of the data to be processed, clock gating can be performed at each timing at which the data is output for each delay unit. The A-side write-signal 307a is used in FIG. 3, but the write-signal 307b may be selected.

Figure 4A:
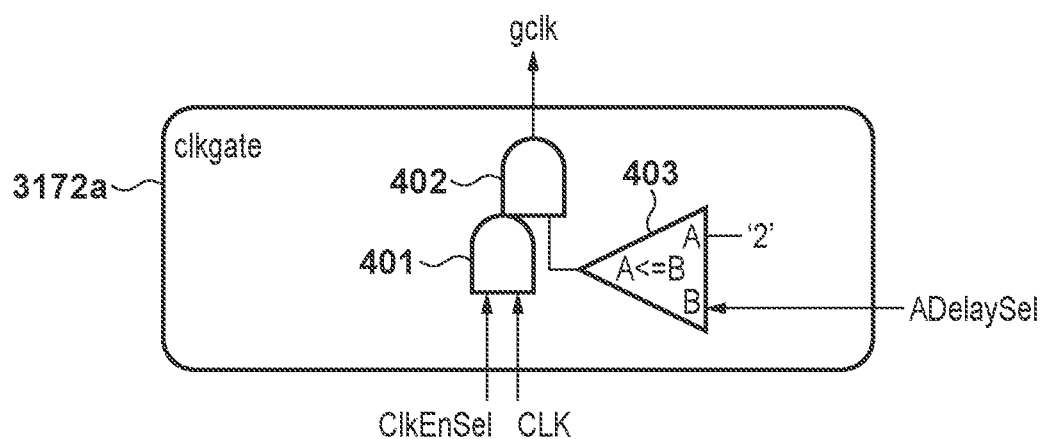
FIG. 4A is a block diagram showing the arrangement of a clock gate control unit according to the first embodiment.

FIG. 4A shows the arrangement of the clock gate unit according to this embodiment. FIG. 4A shows the clock gate unit 3172a as an example. As shown in FIG. 4A, the clock gate unit includes two AND gates 401 and 402 and a comparator 403.

Figure 4B:
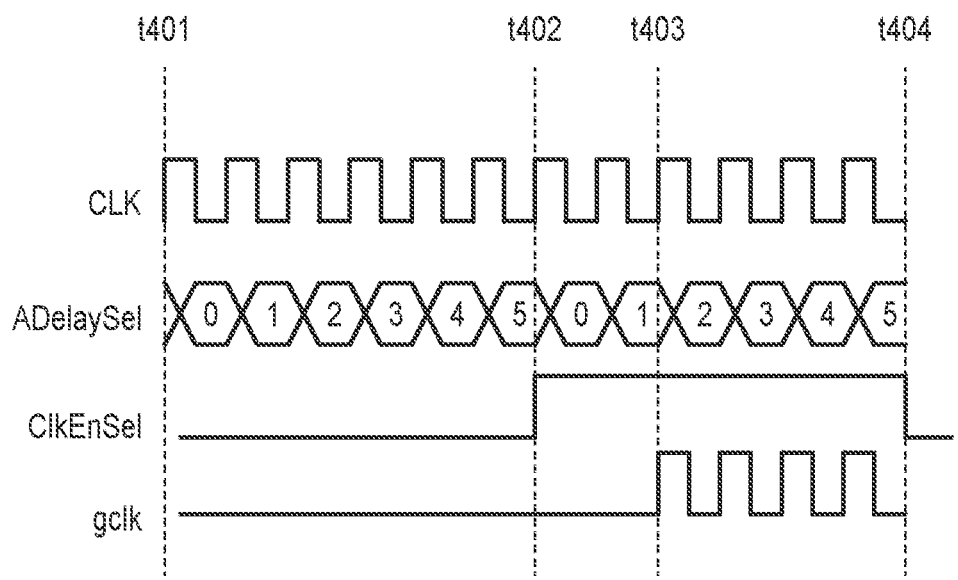
FIG. 4B is a timing chart of the clock gate control unit.

FIG. 4B shows the timing chart of signals in FIG. 4A. The clock gate unit 3172a controls clock gating of the second-stage delay unit of the multi-stage delay unit 308a. For this purpose, "2" is set as the threshold value referred to in comparison of the comparator 403. This threshold value is set by the configuration control unit 103. As a result, a clock is supplied for the first time if the clock enable signal is set at high level and an A-side delay adjustment amount ADelaySel is 2 or more. Although the remaining clock gates have the same arrangement, values suitable for the threshold values set in the comparators are given. With this arrangement, clock gating is possible in accordance with the delay adjustment amount.

Figure 9:
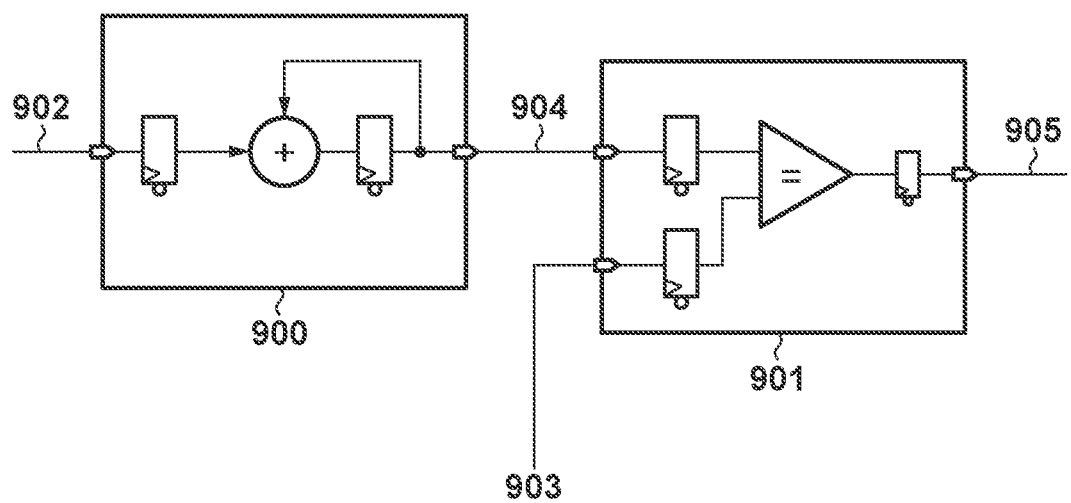
FIG. 9 is a block diagram showing the detailed arrangement when a pulse generating circuit is arranged using an ALU.

The programmable circuit unit 101 is functioned as a desired processing circuit by combining the plurality of ALUs 102 described above. FIG. 9 shows an example in which the programmable circuit unit 101 functions as a pulse generating circuit. FIG. 9 shows the pulse generating circuit formed by using two ALUs 102. Reference numerals 900 and 901 exemplify calculation circuits obtained by setting configuration information in the ALUs 102. The ALU 900 implements a counter (integrating circuit) and uses one input out of the two inputs. The input signal 902 is fixed to a value of 1, thereby implementing an incrementing counter arrangement. On the other hand, the ALU 901 forms a comparator and outputs a pulse signal 905 of high level if the count value of the ALU 900 is equal to a comparison value 903 and the pulse signal 905 of low level otherwise. In this manner, by combining the ALUs, a desired circuit such as a pulse generating circuit can be implemented.

<Example of Programmable Circuit Processing>

This embodiment will describe an example in which the programmable circuit unit 101 executes part of the processing flowchart forming a distance map from the acquisition of a defocus amount by a pupil division method using divided pixels on an image sensor. Known techniques will be used for the arrangement of the image sensor having the divided pixels and the method of acquiring the distance map corresponding parallax images.

Figure 2:
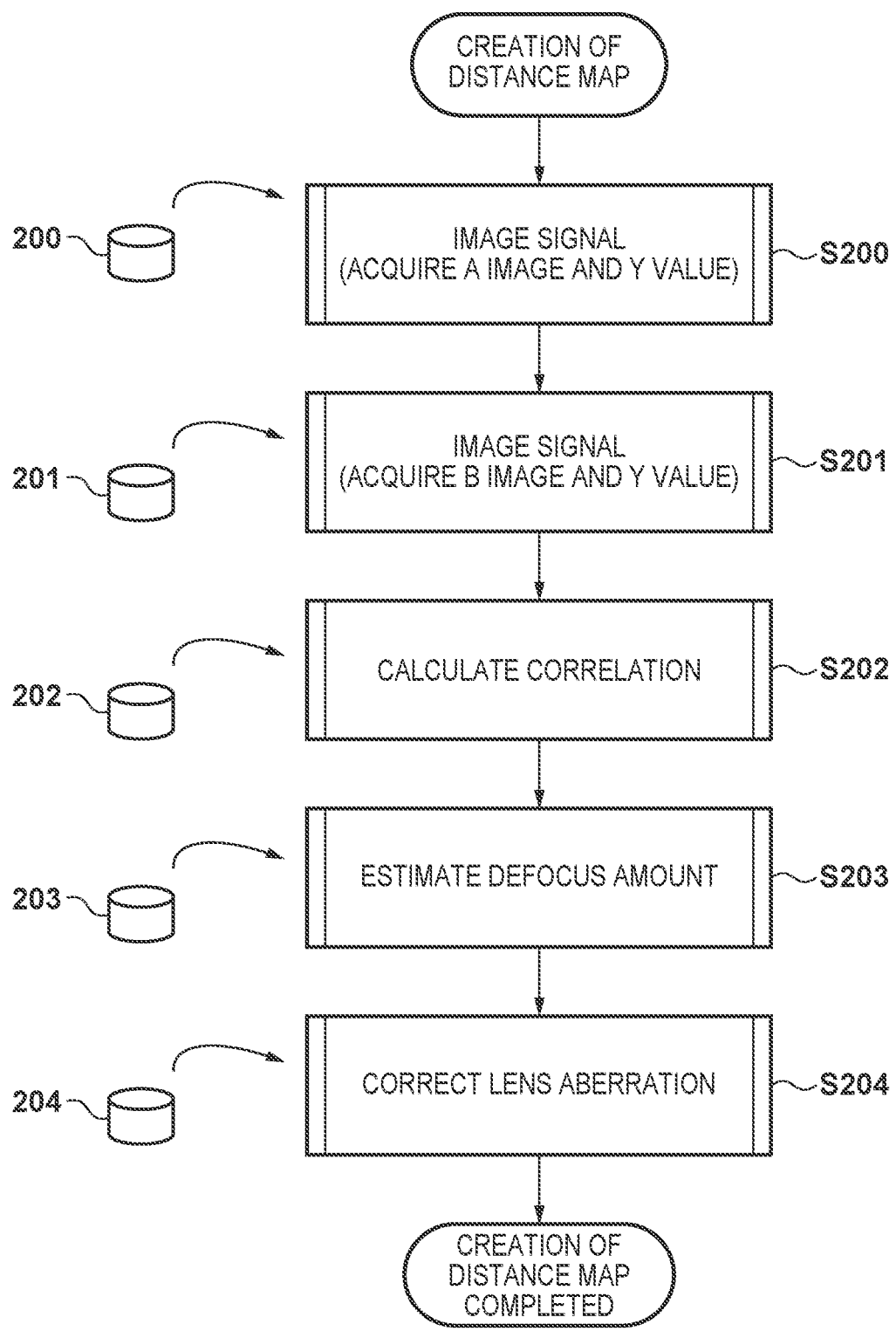
FIG. 2 is a flowchart showing the operation of the signal processing apparatus according to the first embodiment.

FIG. 2 is a flowchart of processing for creating a distance map by detecting a defocus amount from parallax images. The acquisition of the parallax pixels from an image capturing plane and the generation of the distance map itself are conventional techniques. These techniques will not influence the scope of this embodiment, and a description thereof will be omitted. The propagation of the circuit write-signal 105 when the programmable circuit unit 101 executes part of the calculation processing for acquiring the distance map will be exemplified. The parallax images are formed by two divided pixels, which are defined as an A image and a B image, respectively.

In step S200, the CPU 107 acquires a luminance value (to be referred to as a Y value hereinafter) from the A image signal. In step S201, the CPU 107 acquires a Y value from the B image signal.

In step S202, the CPU 107 performs correlation calculation between the parallax images from the Y values obtained in steps S200 and S201.

In step S203, the CPU 107 estimates the defocus amount from a relative image shift amount between the parallax images obtained by the correlation calculation in step S702.

In step S204, the CPU 107 corrects the defocus amount irregularity within the plane, which is caused by the lens aberration.

In this embodiment, the ALU arrangements in the programmable circuit unit 101 are switched in steps S200 to S204. That is, the CPU 107 sets pieces of circuit information 200 to 204 corresponding to steps S200 to S204 for the programmable circuit unit 101. The pieces of circuit information 200 to 204 are stored in the data storing unit 106a in FIG. 1 in advance. The CPU 107 transfers the pieces of circuit information 200 to 204 to the circuit information storing unit 113 at the time of initialization of the programmable circuit unit 101.

The configuration control unit 103 decodes the circuit information 200 and transfers the plurality of register setting values shown by 306a and 306b in FIG. 3 to the respective ALUs 102. The register related to the circuit configuration of the programmable circuit unit 101 has a double buffer arrangement including primary registers like the data storing units 112 and secondary registers like 306a and 306b. The configuration control unit 103 transfers the values transferred to the primary registers based on the circuit information 200 to the secondary registers mounted in the respective ALUs 102. Upon completion of the transfer, the configuration control unit 103 sends a request for the transfer of the circuit information 201 to the circuit information storing unit 113 so as to update the primary registers to the next circuit information.

The timing of causing each secondary register present in each ALU 102 to update the setting value is a timing at which the write-signal propagated in synchronism with the selector output signal set in each setting register reaches each setting register. The write-signal is generated by the timing control unit 104 and is propagated in synchronism with the input signal of the programmable circuit unit 101. In a cycle next to the cycle in which processing for the first circuit setting in each ALU 102 is ended, processing of the second circuit setting can be started. The write-signal propagated through the plurality of ALUs 102 and output from the final ALU 102 is equivalent to a pulse signal indicting that all the processing in the first circuit setting is completed. For this reason, the configuration control unit 103 reads the write-signal output from the final ALU 102 and sets the next circuit setting value in each primary register.

An effect of propagation of the write-signal will be described with reference to FIGS. 5A, 5B, 6A, and 6B.

Figure 5A:
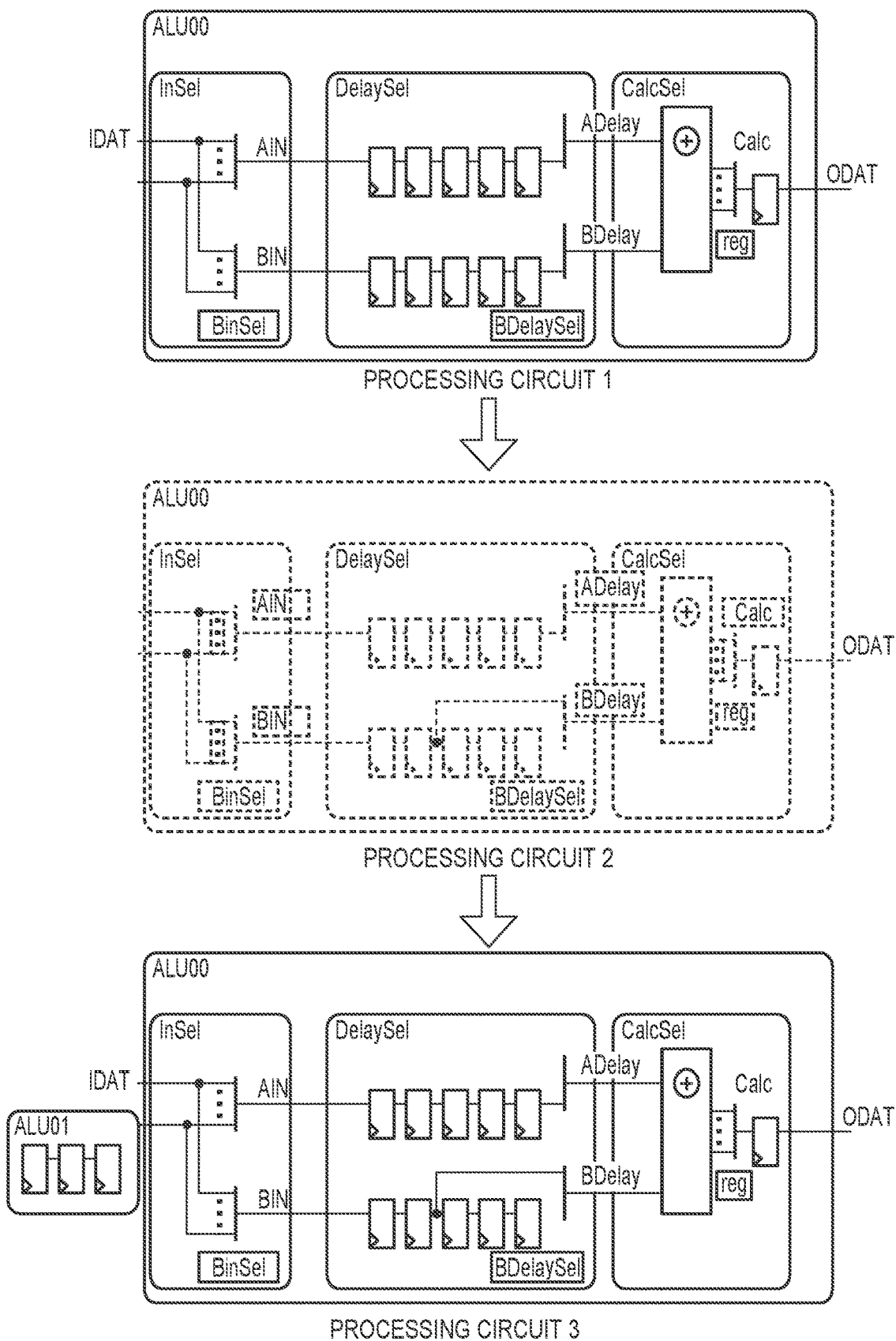
FIG. 5A is a view of transition of the ALU of a programmable circuit.
Figure 5B:
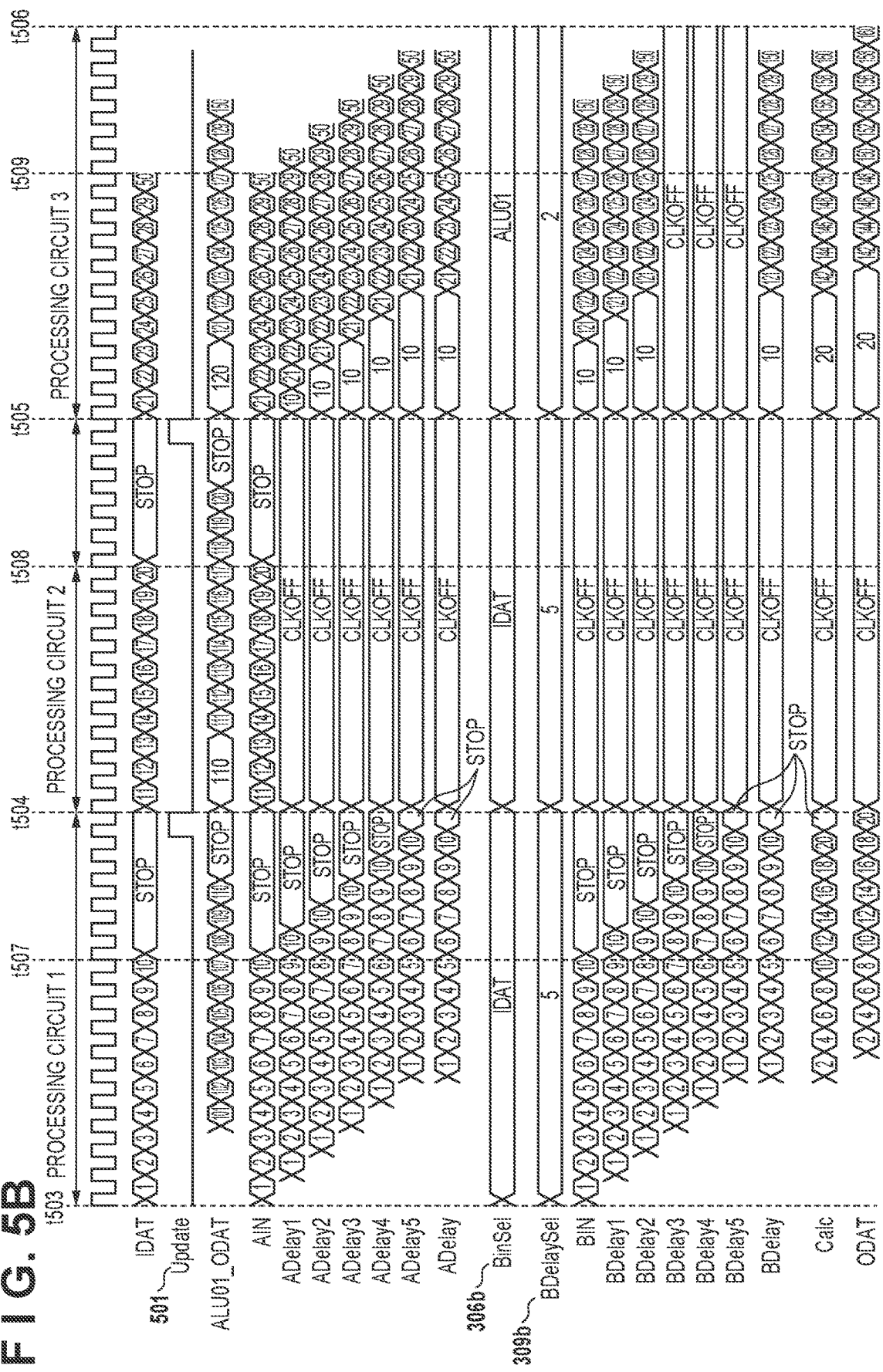
FIG. 5B is a timing chart of the programmable circuit shown in FIG. 5A.
Figure 6A:
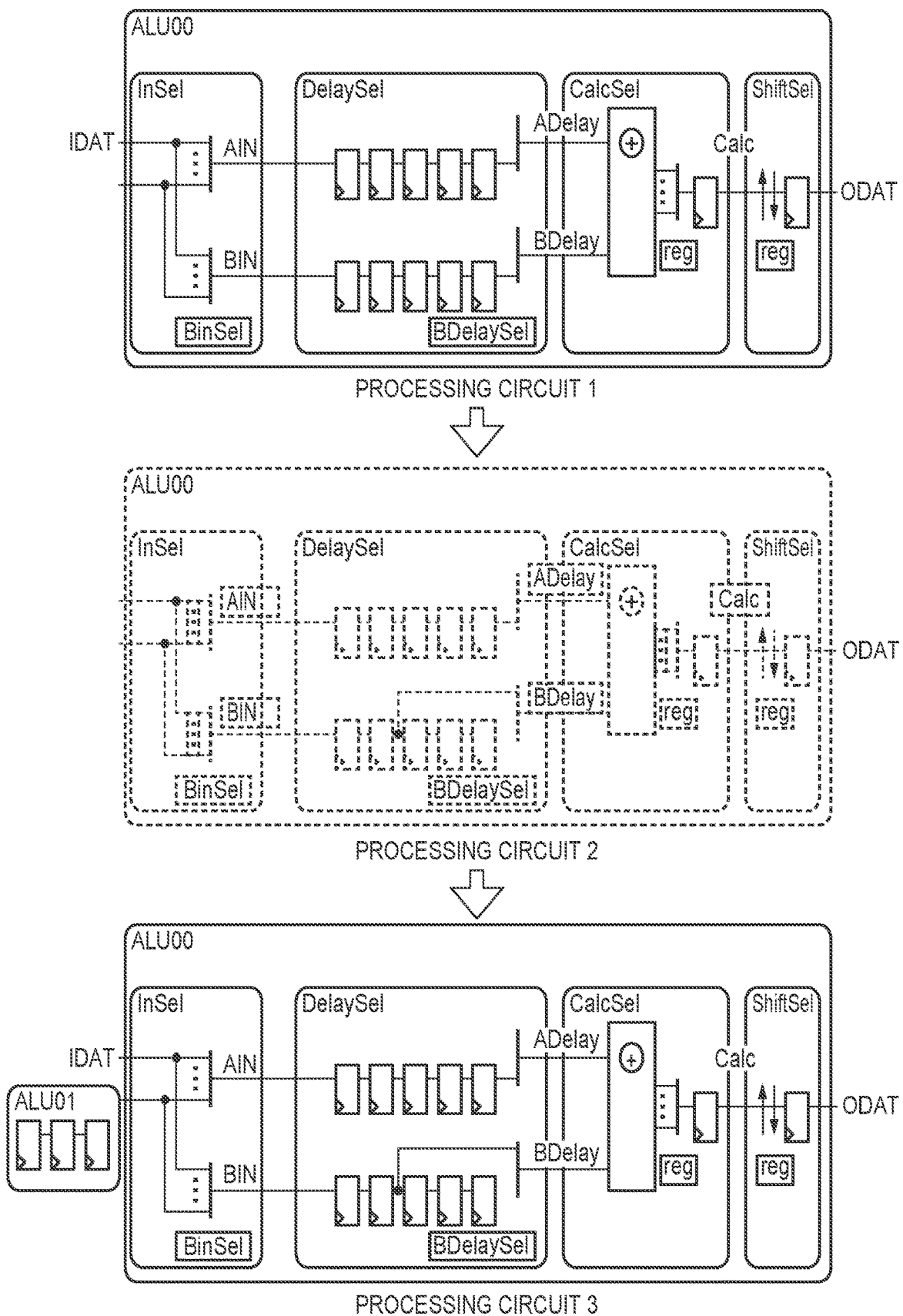
FIG. 6A is a view of transition of the ALU of a programmable circuit according to the first embodiment.

FIG. 6A shows a processing circuit switching state when the write-signal 105 as the main subject of this embodiment is used, and FIGS. 6B-1 and 6B-2 are its timing charts. FIGS. 5A and 5B show the conversional processing circuit switching state when the write-signal is not used, and its timing chart, respectively, in order to perform comparison with FIGS. 6A and 6B.

FIG. 5A shows the sequence in which one ALU00 transitions to a different processing circuit. An illustrated processing circuit 1 is arranged by an addition circuit ALU00 for doubling input data IDAT. A processing circuit 2 shown in FIG. 5A implements a desired processing circuit using an ALU other than the circuit ALU00, so the circuit ALU00 does not perform any calculation. A processing circuit 3 in FIG. 5A shows an addition circuit ALU00 for adding the input data IDAT and the calculation result of a circuit ALU01.

In order to adjust the timing for adding the input data IDAT and the calculation result of the circuit ALU01 the B-side delay adjustment value is changed from 5 to 2 in the processing circuit 3. Each of the processing circuits 1, 2, and 3 processes 10-cycle input data. FIG. 5B shows the timing charts of the processing circuits 1, 2, and 3.

First, signal processing is started at a timing t503. A timing t504 is an input timing of the final data to be processed in the processing circuit 1. In FIGS. 5A and 5B, all the registers are switched all together as in the conventional case. The input data must be stopped until the calculations of the processing circuit 1 are completed in all the ALUs. The input data are kept stopped from a timing t507 to the timing t504 at which processing of the processing circuit 1 for each of all the ALUs is completed. A switching signal 501 is issued to all the registers at the timing t504, and the operation is switched from the setting of the processing circuit 1 to the setting of the processing circuit 2.

Processing of the processing circuit 2 is executed for a period from the timing t504 to a timing t505. Since the circuit ALU00 does not perform any processing, dock gating is performed. For a period from the timing t505 to a timing t506, processing of the processing circuit 3 is executed.

As described above, in the conventional sequence, data input is stopped every time the processing circuit is switched. For this reason, the power consumption of the circuit ALU00 during the period in which a remaining ALU of the programmable circuit unit 101 functions as the processing circuit 2 can be reduced, but the throughput cannot be improved.

To the contrary, in FIGS. 6A and 6B to which this embodiment is applied, the write-signal generated by the timing control unit 104 is used for circuit setting switching. A description will be made with reference to FIGS. 6A and 6B, and in some cases the description will be made with reference to the ALU arranged shown in FIG. 3.

Although details will be clarified below, in the first embodiment, the ALU write timing to set a higher throughput than the conventional case is a timing for inputting final data to be calculated when the ALU data functions as the processing circuit set previously. For this purpose, at a timing t604 at which the circuit ALU00 of interest in the programmable circuit unit 101 receives the final data as the "processing circuit 1", writing for which a remaining ALU other than the circuit ALU00 of interest functions as the "processing circuit 2" is performed.

At this timing t604, in a period for outputting final calculation result data as the "processing circuit 1" to the circuit ALU00 of interest, the configuration control unit 103 sets the clock gating start timing of each of the delay elements of the delay units 308a and 308b already used. Accordingly, the power consumption of the circuit ALU00 of interest until the end of the role as the processing circuit can be reduced.

At a timing t605 for inputting the final data to the ALU functioning as the "processing circuit 2" other than the ALU of interest, in other words, at a timing at which the circuit ALU00 of interest functions as the "processing circuit 3", the configuration control unit 103 set the internal delay units 308a and 308b of the circuit ALU00 such that all the data of the calculation targets are stored. At this time, before the timing for storing the calculation data to the internal delay units 308a and 308b of the circuit ALU00, all the delay units 308a and 308b have undergone clock gating. When the circuit ALU00 of interest is to function as the "processing circuit 3", several delay elements (BDelay3 to BDelay5 in FIGS. 6B-1 and 6B-2) which are unused in the delay units 308a and 308b continue clock gating. As a result, the power consumption of the circuit ALU00 of interest during the switching from the "processing circuit 1" to the "processing circuit 3" can be reduced, and a higher throughput than the conventional case can be implemented. A detailed example will be described below.

In FIGS. 6B-1 and 6B-2, the write-signal is shown as Update 601b. The Update 601b is issued at the timing t604 corresponding to the final data of the processing circuit 1 and is propagated through each ALU in synchronism with the input data. IDAT. For this reason, a timing at which a B-side input signal selecting register BinSel is written to the processing circuit 2 is the timing t604. A timing at which B-side delay adjustment amount selecting register BDelay-Sel is subjected to writing is a timing t611 delayed by five cycles. A switching timing from the processing circuit 2 to the processing circuit 3 is a timing t612 as the ALU01 output timing.

B-side delay unit outputs BDelay1 and BDelay2 and the B-side delay unit outputs BDelay3 to BDelay5 are switched to the processing circuit 2 at timings t607 to t611 sequentially delayed from the timing t604 and subjected to clock gating. With this operation, the stop period is not required for switching the processing circuits, and the throughput can be improved. The clock pulses are sequentially turned on from the timing t611 in the processing circuits 2 and 3. Note that since the B-side delay adjustment amount in the processing circuit 3 is 2 and outputs BDelay3 to BDelay5 are not used in the processing circuit 3, clock gating is performed. In this manner, even in the ALU used for the calculation, the clock gating is performed for each delay unit. In recent years, since an LSI tends to have a large scale, and the number of ALUs of the programmable circuit tends to increase, clock gating is performed for each delay unit in the ALUs 102 as in this embodiment, and power consumption reduction effect can be enhanced.

As described above, according to this embodiment, the write-signal is propagated in synchronism with the data signal, and clock gating is performed based on the write-signal and the delay adjustment amount in the ALU. Accordingly, there can be provided a signal processing apparatus capable of reducing the power consumption by executing writing of the circuit information in a pipeline form, increasing the throughput of the programmable circuit, and performing clock gating for each delay unit.

Second Embodiment

The second embodiment of the present invention will be described below. In the first embodiment, there exists a period for inputting unnecessary data to the delay adjusting unit when the delay adjustment amount in the ALU is reduced by an increase of the input data delay amount upon a change in processing circuit. More specifically, in the care of FIGS. 6A and 6B, this period is a period from the timing t614 to the timing t616 with respect to BDelay1, and a period from timing t615 to the timing t617 with respect to BDelay2.

Since this period contains a clock pulse which does not contribute to the output of the circuit ALU00, the power consumption increases. According to the second embodiment, the clock gating period is prolonged in accordance with a change in the delay adjustment amount in the ALU by the change of the processing circuit.

FIG. 12 shows the arrangement of an ALU according to the second embodiment. The same reference numerals as in FIG. 3 denote similar constituent elements in FIG. 12. FIG. 12 has a large difference from FIG. 3 in that a counter 1201 for prolonging the dock gating period for the clock gate enable signal is added. A configuration control unit 103 calculates a change amount 1302 of the delay adjustment amount when the processing circuit is changed and sets the calculated value in the counter 1201. Accordingly, the clock gate enable period (clock stop period) can be prolonged by a decrease in the delay adjustment amount.

Figure 13A:
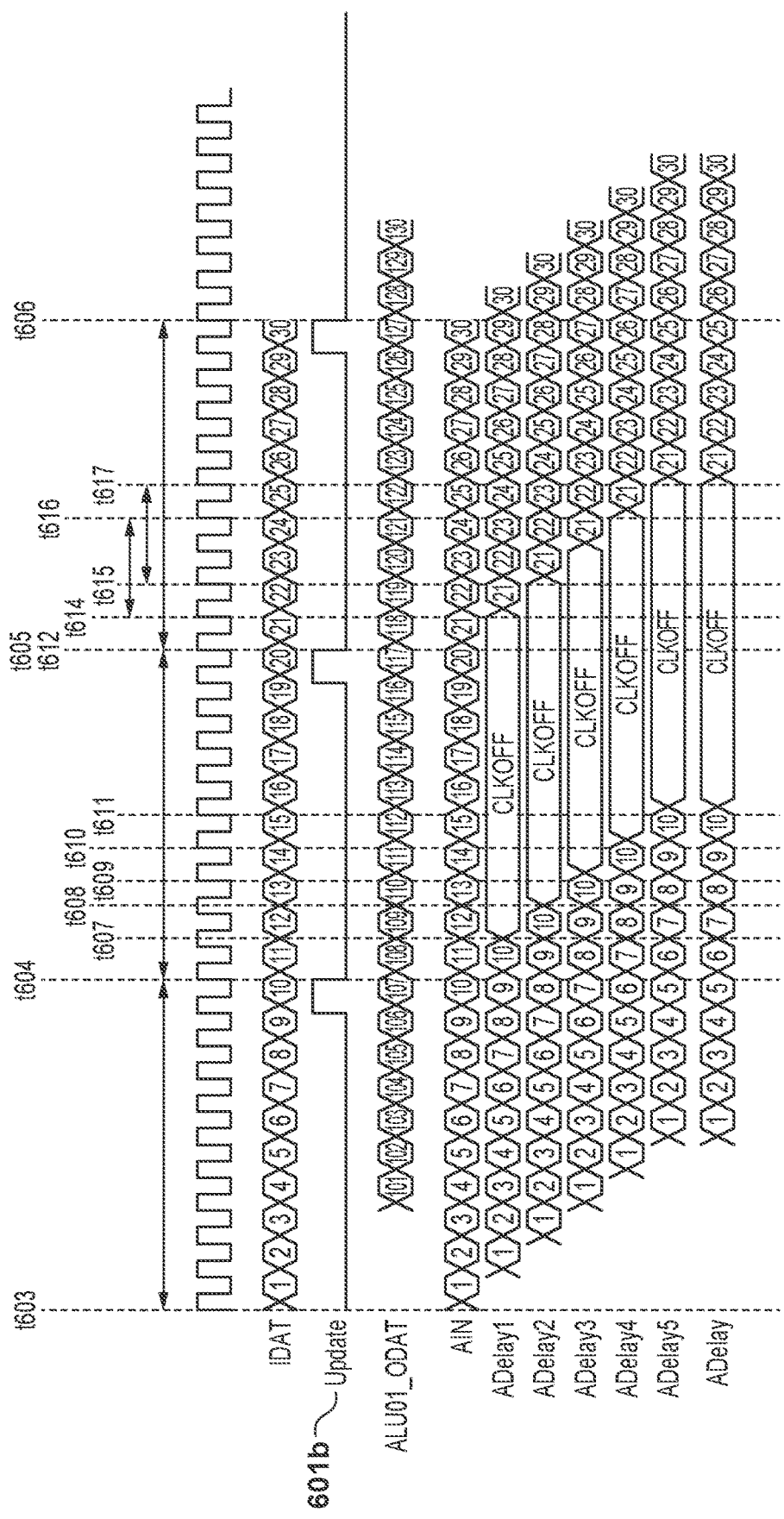

FIGS. 13A and 13B are timing charts according to the ALU transition in the second embodiment. Note that the ALU transition is identical to that of FIG. 6A.

By using a signal 1301 whose clock enable period is prolonged with respect to a clock enable signal 320 of the first embodiment, the delay units BDelay1 and BDelay2 are subjected to clock gating for a period of timings t614 to t616 and a period of the timings t615 to t617.

As described above, according to the second embodiment, the clock gating period is prolonged in accordance with the change in the delay adjustment amount in the ALU by the change of the processing circuit, so that the clock gating period of the delay unit in the ALU can be optimized and the power consumption can be lower than that in the first embodiment.

Third Embodiment

The third embodiment according to the present invention will be described below. In the first embodiment described above, the clock gate enable signal is delayed and propagated in the clock gate control unit 106. However, a configuration control unit 103 can directly control the clock gate enable signal.

Figure 7:
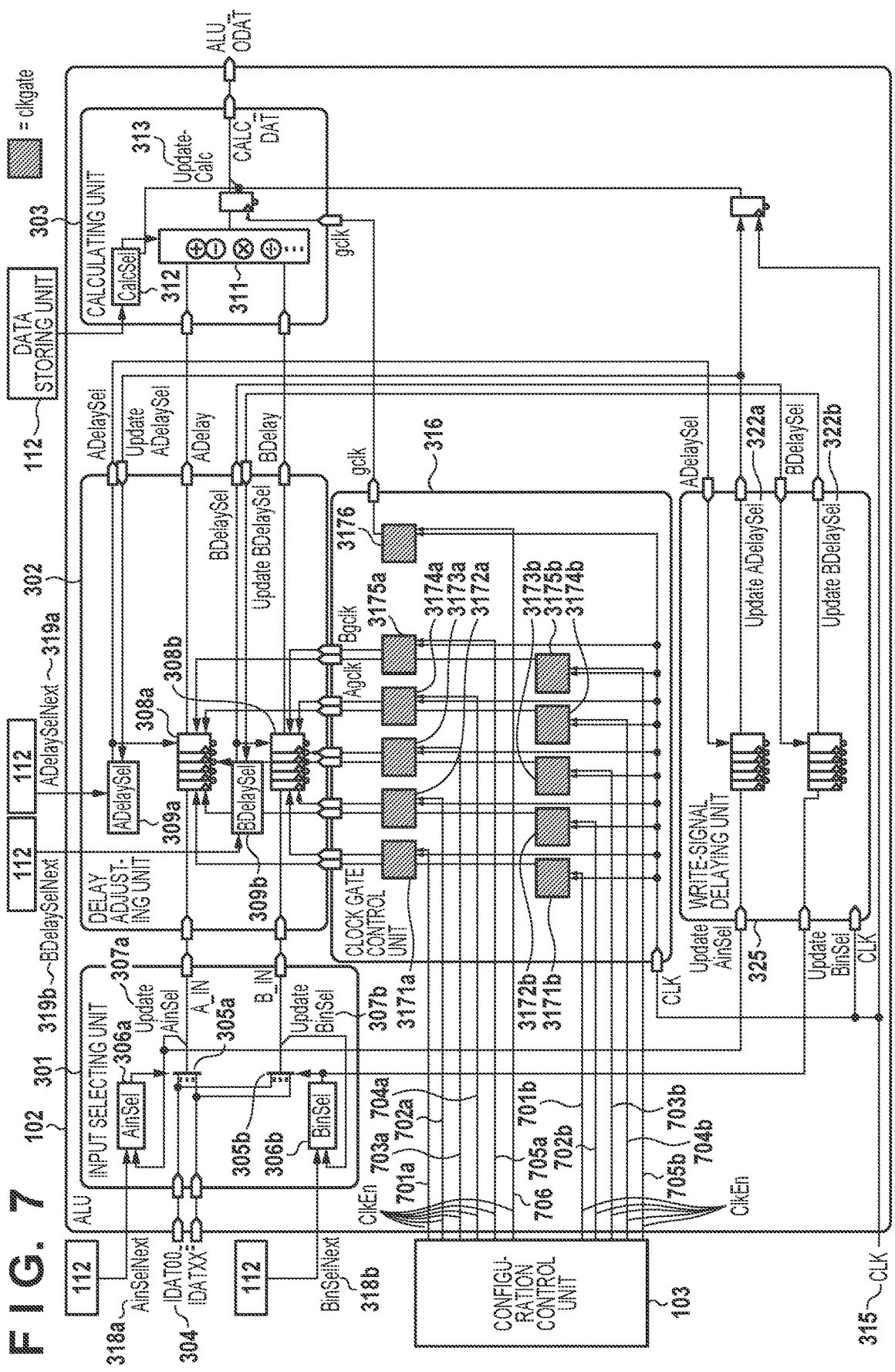
FIG. 7 is a block diagram showing the arrangement of an ALU according to the third embodiment.

FIG. 7 shows the arrangement of are ALU according to the third embodiment. The same reference numerals as in FIG. 3 denote similar constituent elements in FIG. 7. In FIG. 7, there is no delay unit for delaying the clock gate enable signal in a clock gate control unit 316, and the clock enable signal is connected from the configuration control unit 103 to each clock gate unit 317. The configuration control unit 103 acquires the configuration information from a circuit information storing unit 113 and can grasp the delay adjustment amount and the clock enable state of each ALU 102. Accordingly, the clock enable signal can be directly set in each delay unit of the ALU 102. To ensure the flexibility in the programmable circuit, since the number of ALUs 102 is large, the clock enable delay unit of the ALU 102 is omitted to reduce the circuit scale.

As described above, according to the third embodiment, the configuration control unit can set the clock enable signal to each delay unit of each ALU, thereby reducing the circuit scale as compared with the first embodiment.

Fourth Embodiment

Next, the fourth embodiment of the present invention will be described below. Clock gate control is performed for an ALU which is not used for the calculation in the first embodiment, thereby reducing the power consumption. However, a fixed value may be input.

Figure 8:
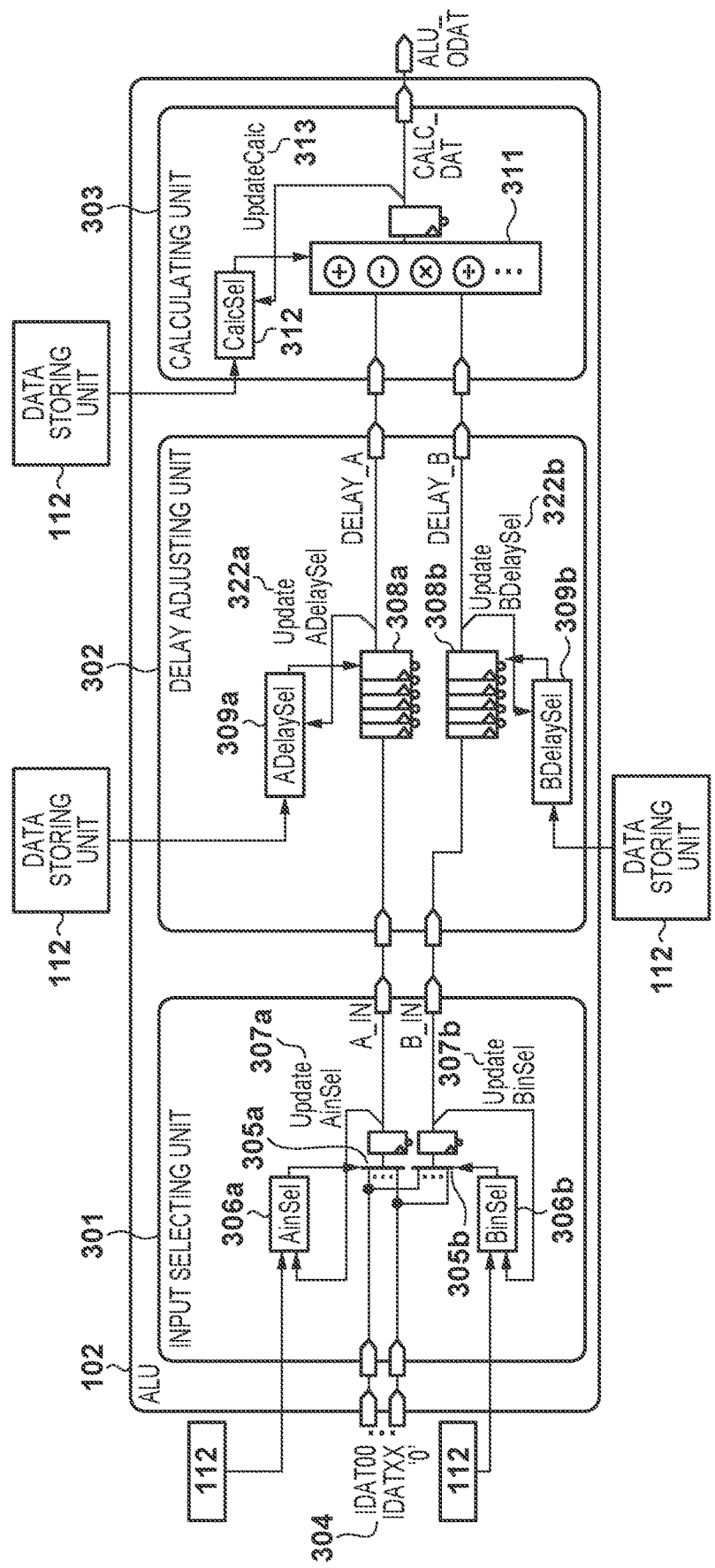
FIG. 8 is a block diagram showing the arrangement of an ALU according to the fourth embodiment.

FIG. 8 shows the arrangement of an ALU according to the fourth embodiment. The same reference numerals as in FIG. 3 denote similar constituent elements in FIG. 8. In FIG. 8, there is no clock gate control unit 316. Since no clock gate control is performed, the delay adjustment of the write-signal is performed by a delay adjusting unit 302.

According to the fourth embodiment, a fixed value is input to an ALU which is not used for the calculation of a desired processing circuit. For this purpose, as for the ALU which is not used, preset circuit information can be prepared to select a fixed value. The dynamic power as the power at the time of operating a CMOSLSI predominantly has switching power generated when the data of each delay unit is changed. For this reason, by inputting the fixed value to each ALU which is not used for the calculation, the switching power of each ALU can be reduced.

FIGS. 10A and 10B are timing charts of this embodiment. As in FIG. 6A, the ALU transition is performed by processing circuits 1, 2, and 3. A difference from FIG. 6A is that clock gate control is not performed in the processing circuit 2, but a fixed value of 0 is input to it.

With this arrangement, without performing clock gating control, the circuit scale can be reduced, and the switching power for a non-calculation period can be reduced.

Figure 11:
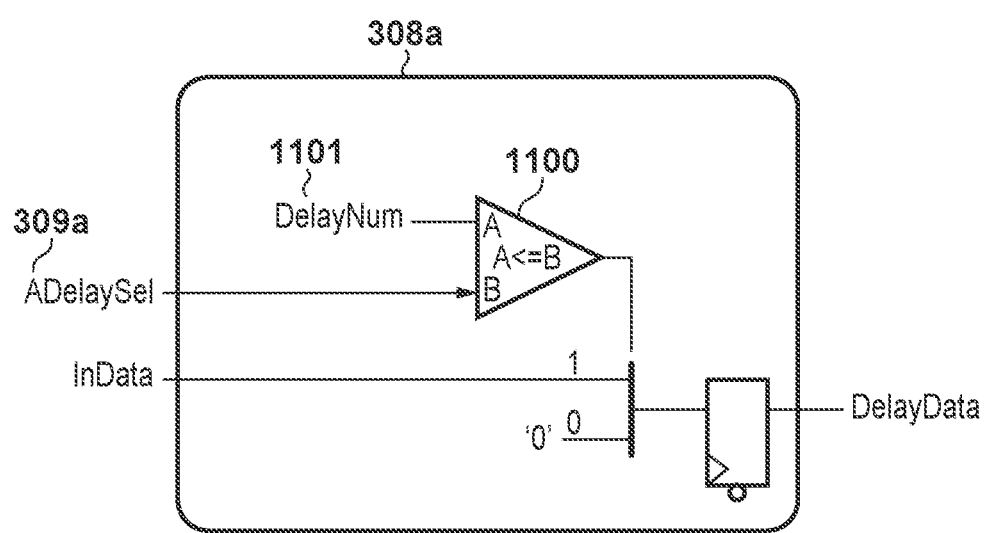
FIG. 11 is a block diagram showing the arrangement of a delay unit in a delay adjusting unit according to the fourth embodiment.

When delay units 308a and 309b of the delay adjusting unit 302 are arranged, as shown in FIG. 11, the switching power for each delay unit can be reduced even if the ALU is used for the calculation. DelayNum 1101 represents the number of the delay units 308a. With this arrangement, the fixed value of 0 can be input to the delay units whose number is larger than a delay adjustment amount ADelaySel, thereby further reducing the power consumption. FIGS. 14A and 14B show the timing charts. In the ALU transition of FIG. 6A, a portion clock-gated in the processing circuit 2 becomes the fixed value of 0.

In addition, the fixed value may be any value except 0 such as 10. For example, if the first processing circuit forms an integrator, and the ALU input value is set to the fixed value except 0 because the second processing circuit is not used for the calculation, the integral value is unintentionally updated. For this reason, an increase in power consumption by an unnecessary integrating operation by using the enable signal for controlling the integrating operation can be suppressed.

As described above, according to the fourth embodiment, the fixed value is input to the ALU which is not used for the calculation, thereby reducing the switching power.

Although the first to fourth embodiments have been described above, as can be apparent from the above description, the writing of the circuit information is executed in a pipeline form, the throughput of the programmable circuit is improved, and the dock gating is performed for each delay element of the delay unit, thereby reducing the power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-011044, filed Jan. 27, 2020, which is hereby incorporated by reference herein in its entirety.

What is claimed is:

1. An information processing apparatus comprising:
a programmable circuit including a plurality of 2-input 1-output ALUs (Arithmetic and Logic Units); and
an updating unit configured to update the programmable circuit in accordance with circuit information set at a set timing,
wherein each of the ALUs in the programmable circuit includes
a calculation unit configured to perform a set type of calculation for two data and output a calculation result,
a delay unit configured to delay the two input data in accordance with delay amounts independently set and supply the delayed data to the calculation unit, and
a controller configured to control a delay amount for the delay unit and a calculation timing for the calculation unit in accordance with externally set information, and
wherein the updating unit sets clock gating start timings for a plurality of delay elements of the delay unit if an ALU of interest as a first processing circuit in the programmable circuit inputs final data to be processed.

2. The apparatus according to claim 1, wherein if a remaining ALU except an ALU of interest in the programmable circuit inputs final data as a second processing circuit, the updating unit sets a clock supply start timing for a delay element to be used in the delay unit so that the ALU of interest functions as a third processing element and sets to continue clock gating for a delay element which is not used as the third processing circuit.

3. The apparatus according to claim 1, wherein the programmable circuit is one of an FPGA (Field Programmable Gate Array) and a PLD (Programmable Logic Device).

4. An information processing apparatus comprising:
a programmable circuit including a plurality of 2-input 1-output ALUs (Arithmetic and Logic Units); and
an updating unit configured to update the programmable circuit in accordance with circuit information set at a set timing,
wherein each of the ALUs in the programmable circuit includes
a selector configured to select two input data corresponding to setting out of a plurality of input data including a preset fixed value, and
a calculation unit configured to perform a set type of calculation for two data selected by the selector,
wherein the updating unit sets, for an ALU which is not used in the programmable circuit, that the selector selects the fixed value.

5. The apparatus according to claim 4, wherein the programmable circuit is one of an FPGA (Field Programmable Gate Array) and a PLD (Programmable Logic Device).

6. A method of controlling an information processing apparatus including a programmable circuit including a plurality of 2-input 1-output ALUs (Arithmetic and Logic Units), the method comprising:
updating the programmable circuit in accordance with circuit information set at a set timing,
wherein each of the ALUs in the programmable circuit includes
a calculation unit configured to perform a set type of calculation for two data and output a calculation result,
a delay unit configured to delay the two input data in accordance with delay amounts independently set and supply the delayed data to the calculation unit, and
a controller configured to control a delay amount for the delay unit and a calculation timing for the calculation unit in accordance with externally set information, and wherein in the updating, clock gating start timings for a plurality of delay elements of the delay unit are set if an ALU of interest as a first processing circuit in the programmable circuit inputs final data to be processed.

7. A non-transitory computer-readable storage medium storing a program which, when read and executed by a computer including a programmable circuit including a plurality of 2-input 1-output ALUs (Arithmetic and Logic Units), causes the computer to perform the step of a method of controlling an information processing apparatus, the method comprising:

updating the programmable circuit in accordance with circuit information set at a set timing, wherein each of the ALUs in the programmable circuit includes a calculation unit configured to perform a set type of calculation for two data and output a calculation result, a delay unit configured to delay the two input data in accordance with delay amounts independently set and supply the delayed data to the calculation unit, and a controller configured to control a delay amount for the delay unit and a calculation timing for the calculation unit in accordance with externally set information, and wherein in the updating, clock gating start timings for a plurality of delay elements of the delay unit are set if an ALU of interest as a first processing circuit in the programmable circuit inputs final data to be processed.

* * * * *